United States Patent [19]
Rupp

[11] Patent Number: 6,107,168
[45] Date of Patent: *Aug. 22, 2000

[54] PROCESS FOR PASSIVATING A SILICON CARBIDE SURFACE AGAINST OXYGEN

[75] Inventor: Roland Rupp, Lauf, Germany

[73] Assignee: Siemens Aktiengesellschaft, Munich, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/945,155

[22] PCT Filed: Mar. 29, 1996

[86] PCT No.: PCT/DE96/00553

§ 371 Date: Dec. 18, 1997

§ 102(e) Date: Dec. 18, 1997

[87] PCT Pub. No.: WO96/32740

PCT Pub. Date: Oct. 17, 1996

[30] Foreign Application Priority Data

Apr. 13, 1995 [DE] Germany .................... 195 14 079

[51] Int. Cl.[7] .................................................. H01R 31/08
[52] U.S. Cl. ...................... 438/509; 438/779; 438/767; 438/796; 438/931
[58] Field of Search ..................................... 438/779, 767, 438/796, 797, 931, 509; 117/929; 427/122

[56] References Cited

U.S. PATENT DOCUMENTS

| | | | |
|---|---|---|---|
| 4,472,476 | 9/1984 | Veltri et al. ............................. | 428/215 |
| 5,397,428 | 3/1995 | Stoner et al. ............................ | 117/86 |
| 5,420,443 | 5/1995 | Dreifus .................................... | 257/77 |
| 5,945,155 | 8/1999 | Grill ........................................ | 427/122 |

FOREIGN PATENT DOCUMENTS 0 381 111   8/1990   European Pat. Off. .

OTHER PUBLICATIONS

Ray, S. et al., Diamond–Like Carbon Films Prepared by Photochemical Vapour Deposition, *J. Appl. Phys.*, vol. 32 (1993), pp. L–1559–L1561.

IBM Technical Disclosure Bulletin, vol. 36, No. 06A (1993), p. 423.

Rupp, R. et al., "First results on silicon carbide vapour phase epitaxy growth in a new type of vertical low pressure chemical vapour deposition reactor," *Journal of Crystal Growth*, vol. 146 (1995), pp. 37–41.

Bellina, J. et al., "Stoichiometric Changes In the Surface OF (100) Cubic SiC Caused By Ion Bombardment And Annealing," *Applied Surface Science*, 25 (1986), pp. 380–390.

Bellina, J. et al., Surface modification strategies for (100)3C–SiC, *J. Vac. Sci. Technol.*, A4(3) May–Jun. 1986, pp. 1692–1695.

Chemical Abstract, vol. 118, (1993), p. 847.

Diani, M. et al., "Electron cyclotron resonance plasma ion beam effects on the formation of SiC on Si(001) characterized by in–situ photo emission," *Thin Solid Films*, vol. 241 (1994), pp. 305–309.

Harris, C. et al., "SiC power device passivation using porous SiC," *Applied Physics Letters*, vol. 66 (1995) Mar. 20, No. 12, pp. 1501–1502.

*Primary Examiner*—Charles Bowers
*Assistant Examiner*—Matthew Whipple
*Attorney, Agent, or Firm*—Kenyon & Kenyon

[57] ABSTRACT

In the manufacture of semiconductor components, a SiC single crystal is exposed, during storage or transport between two process steps, to an oxygen-containing gas atmosphere, for example air. In order to prevent an oxide coating from forming on the SiC surface of the SiC single crystal, a carbon coating which does not react chemically with oxygen, preferably a graphite coating, is produced on said SiC surface.

14 Claims, No Drawings

PROCESS FOR PASSIVATING A SILICON CARBIDE SURFACE AGAINST OXYGEN

BACKGROUND OF THE INVENTION

The invention concerns a method for passivating a silicon carbide (SiC) surface against oxygen.

A plurality of semiconductor structures based on silicon carbide (SiC) as the semiconductor material are known. In the manufacture of such SiC semiconductor structures, the surfaces of SiC single crystals, which in some cases are already preprocessed, must often be exposed to an oxygen-containing atmosphere, for example during interim storage of the SiC single crystal or transport from one process location to another. In an oxygen-containing atmosphere, however, a natural oxide coating consisting of $SiO_2$ forms on the surface of the SiC single crystal. The thickness of this oxide coating after one week in air, for example, is already 2 nm. This natural oxide coating is generally undesirable, and must therefore be removed, by sputtering or with hydrofluoric acid (HF), before a subsequent process step.

It is known, from the publication Thin Solid Films 241 (1994), pp. 305–309, to treat silicon carbide surfaces with a hydrogen ($H_2$) plasma and saturate the free bonds at the SiC surface by deposition of $H_2$ ions. A general passivation is achieved thereby.

SUMMARY OF THE INVENTION

It is the object of the invention to passivate a SiC surface against oxygen in order to prevent an oxide coating from forming on said SiC surface in an oxygen-containing atmosphere.

This object is achieved, according to the invention, with the features of claim 1 or claim 12.

The invention is based on the conception of using a carbon coating to passivate the SiC surface. In contrast to an exposed SiC surface, no oxide coating forms on the carbon layer because of the low chemical affinity of carbon for oxygen. The SiC surface equipped with this carbon passivation can therefore be stored or transported for practically any length of time in an oxygen-containing atmosphere such as, for example, air.

The method is particularly advantageous in the manufacture of a semiconductor structure in which the surface of a SiC single crystal must be exposed to an oxygen-containing atmosphere between a first and a second process step. Before the SiC single crystal comes into contact with the oxygen-containing gas mixture, a carbon coating which is substantially chemically inert with respect to oxygen is generated on at least a part of its SiC surface. The carbon coating can then be removed again immediately before the second process step, or processed further in said second process step.

Advantageous embodiments and developments of the passivation method according to the invention are evident from the claims which depend upon claim 1.

DETAILED DESCRIPTION OF THE INVENTION

In a particularly advantageous embodiment, the carbon coating is produced by evaporating (subliming) silicon atoms off from the SiC surface. For this purpose, the SiC surface is preferably brought, in a vacuum or in an inert gas atmosphere, to a temperature of at least approximately 1000° C. The carbon coating can, however, also be produced by chemical vapor deposition (CVD) or molecular beam epitaxy (MBE). Preferably a carbon coating having a crystal structure at least similar to the structure of graphite is produced. In a preferred embodiment, the thickness of the carbon coating is established at less than 1 nm. The carbon coating then comprises only a few atomic layers, or even only one layer of carbon atoms.

In a further embodiment, bound oxygen is removed from the SiC surface before the carbon coating is produced, at temperatures of at least 500° C. in a hydrogen atmosphere.

The invention will now be explained with reference to exemplifying embodiments.

In a first exemplifying embodiment of the method for protecting a SiC surface from oxidation, carbon is delivered to the SiC surface in elemental form (C), for example by sputtering, or in the form of a chemical carbon compound, for example by CVD or MBE. From the delivered carbon, a carbon coating is deposited on the SiC surface. In a CVD or MBE process, a hydrocarbon gas such as, for example, $C_2H_2$ is generally used, from which—when process conditions such as, in particular, pressure and temperature are established appropriately—the carbon coating forms by chemical reactions in the region of the SiC surface. Typical process temperatures for the growth of the carbon coating lie between 500° C. and 1500° C.

In a second exemplifying embodiment of the antioxidation or passivation method, silicon atoms bound in the SiC are removed, preferably evaporated, from the SiC surface and/or the SiC located therebeneath. In order to evaporate (sublime) the silicon atoms off, the SiC surface is preferably subjected to a heat treatment at temperatures of at least 1000° C., preferably in a vacuum or in an inert gas atmosphere at, in principle, any pressure, in particular between 20 and 1000 torr. An "inert gas" is in this context understood to mean a gas that practically does not react chemically with SiC at the temperatures used, for example argon (Ar). Since the vapor pressure of silicon (Si) in the SiC is higher than the vapor pressure of the carbon (C), an excess of carbon atoms remains behind when the silicon atoms evaporate off at the SiC surface. These excess carbon atoms form into a carbon coating. The result is a new, slightly set-back SiC surface which adjoins the carbon coating.

Both by delivering carbon in accordance with the first exemplifying embodiment, and by evaporating silicon in accordance with the second exemplifying embodiment, a carbon coating is therefore produced at the SiC surface. With this carbon termination, the SiC surface can now be exposed to an oxygen-containing gas such as, for example, air. The reason is that even at high temperatures, a permanent oxide coating does not form at the carbon coating. At temperatures around room temperature (25° C.), the carbon of the carbon coating reacts practically not at all with oxygen. At higher temperatures, essentially only volatile carbon oxides form. The carbon coating can, for example, be manufactured with a substantially amorphous structure and, preferably, with a graphite structure or at least a graphite-like structure. In an advantageous embodiment, a carbon coating less than 1 nm thick is produced.

In a third exemplifying embodiment of the method, formation of an oxide coating is prevented on one surface of a SiC single crystal as a SiC surface. The SiC surface used is then preferably one of the basal planes, i.e. a silicon plane or a carbon plane, of the SiC single crystal. The silicon plane corresponds to a (1 1 1) crystal surface in the basal crystal lattice for a SiC single crystal of the 3C cubic polytype (β-SiC), and a (0 0 0 1) crystal surface in the basal crystal lattice of a SiC single crystal of a non-cubic polytype such as, for example, 4H, 6H, or 15R ([α]-SiC). The carbon plane is understood, on the other hand, to be a (−1 −1 −1) crystal surface in the basal crystal lattice for a SiC single crystal of the 3C cubic polytype (β-SiC), and a (0 0 0 1) crystal surface in the basal crystal lattice for a SiC single crystal of a non-cubic polytype such as, for example, 4H, 6H, or 15R (α-SiC).

In this third exemplifying embodiment of the method, the carbon coating is then preferably, as in the second exemplifying embodiment, produced by evaporating silicon atoms from the SiC surface. For this purpose the silicon plane or the carbon plane of the SiC single crystal is subjected to a heat treatment (already described) at temperatures of at least 1000° C., in a vacuum or in an inert gas. By way of the time profile of the heat treatment and the temperatures used, it is possible to establish very precisely how many individual (1 1 1) or (0 0 0 1) silicon atom layers are removed from the SiC crystal lattice. In addition and in particular, only the topmost silicon atom layer can be removed. This then yields, on the silicon plane, a very thin carbon coating made up of only a monolayer of carbon atoms, and on the carbon plane, a carbon coating made up of two carbon atom layers. The carbon remaining behind on the surface generally rearranges, by saturation of open bonds, into a graphite structure or graphite-like structure (graphitization). Evaporation of silicon atoms from the silicon plane or the carbon plane of a SiC single crystal with various heat treatments, and spectrographic examinations of the resulting carbon coatings, are described in the article Muehlhoff et al., "*Comparative electron spectroscopic studies of surface segregation on SiC (0 0 0 1) and SiC (0 0 0 −1),*" *Journal of Applied Physics,* Vol. 60, No. 8, Oct. 15, 1986, pages 2842 to 2853, the content of which is incorporated into the disclosure of this application.

In a fourth exemplifying embodiment, bound oxygen is removed from the SiC surface before the carbon coating is produced. Particularly suitable for the purpose are plasma etching, etching with hydrofluoric acid (HF), and preferably a heat treatment in a substantially pure hydrogen atmosphere at temperatures of at least 500° C., in particular at least 800° C. and preferably at least 1200° C. The pressure is preferably established, in this context, at more than approximately 5 mbar.

In a fifth exemplifying embodiment, the method for passivating a SiC surface against oxygen is used in a semiconductor manufacturing process in which the SiC surface of a SiC single crystal is exposed, between two process steps, to an oxygen-containing atmosphere. An example of such oxygen exposure is the transport or storage of a single-crystal SiC semiconductor substrate, or of a SiC epitaxial coating arranged on a substrate, in air before further processing steps such as structuring, doping, or contacting.

The carbon coating produced for protection against oxidation can be removed again before a further process step, and the exposed SiC surface can be processed further in that process step. A plasma etching method in hydrogen ($H_2$) can be used to remove the carbon coating.

As an alternative thereto, the carbon coating can, in the further process step, be converted at least partially, with at least one carbide-forming metal such as, for example, tungsten (W), titanium (Ti), tantalum (Ta), boron (B), aluminum (Al), nickel (Ni), or scandium (Sc), in a metal carbide coating, in order to manufacture an electrical contact on the surface of the SiC single crystal. The metal carbide coating on the SiC single crystal is preferably used as a Schottky contact.

In all the exemplifying embodiments, the SiC single crystal is preferably grown by chemical vapor deposition (CVD) or molecular beam epitaxy (MBE) as a SiC coating on a substrate, at temperatures of generally at least 1100° C. and preferably at least 1500° C. A particular variant for manufacture of the SiC single crystal is atomic layer epitaxy (ALE), in which silicon atom layers and carbon atom layers are produced alternatively in successive CVD or MBE process steps in order to build up the SiC crystal lattice. The carbon coating can then be manufactured immediately thereafter, also by CVD or MBE, by stopping the delivery of silicon to the growing SiC single crystal and delivering only carbon. In addition, the carbon coating can also be produced, immediately after the CVD or MBE process for manufacturing the SiC single crystal, by interrupting the delivery of both silicon and carbon and cooling the SiC single crystal, in a vacuum or in an inert gas atmosphere, with a defined temperature profile over time, generally to room temperature.

The sic single crystal can, however, also be manufactured by a sublimation process.

What is claimed is:

1. A passivation method for a silicon carbide (SiC) surface, comprising the steps of:
    a) producing a SiC single crystal having said SiC surface by deposition on a substrate,
    b) producing a carbon coating on said SiC surface by stopping silicon delivery at the end of said deposition and by delivering only carbon, and
    c) exposing the carbon coated SiC surface to an oxygen-containing atmosphere, wherein the SiC surface is protected against oxidation by the carbon coating.

2. The method as defined in claim 1, wherein the SiC single crystal and the carbon coating are produced by chemical vapor deposition.

3. The method as defined in claim 1, wherein the SiC single crystal and the carbon coating are produced by molecular beam epitaxy.

4. The method as defined in claim 1, wherein a silicon plane of the SiC single crystal that corresponds in the case of a cubic polytype of the SiC (β-SiC) to a (1 1 1) crystal surface, and corresponds in the case of a non-cubic polytype (α-SiC) to a (0 0 0 1) crystal surface, is used as the SiC surface.

5. The method as defined in claim 1, wherein a carbon plane of the SiC single crystal that corresponds in the case of a cubic polytype of the SiC (β-SiC) to a (−1 −1 −1) crystal surface, and corresponds in the case of a non-cubic polytype (α-SiC) to a (0 0 −1) crystal surface, is used as the SiC surface.

6. The method as defined in claim 1, wherein the carbon coating has substantially a graphite structure or a graphite-like structure.

7. The method as defined in claim 1, wherein a carbon coating having a thickness less than 1 nm is produced.

8. A passivation method for a silicon carbide (SiC) surface, comprising the steps of:
    a) depositing a SiC single crystal having said SiC surface on a substrate at a temperature of at least 1100° C.,
    b) forming a carbon coating immediately following the depositing step, by interrupting the delivery of silicon and carbon, and producing said carbon coating on said SiC surface by cooling the SiC single crystal in vacuum or in an inert gas atmosphere, wherein silicon atoms are evaporated off from said SiC surface, and
    c) exposing the carbon coated SiC surface to an oxygen containing atmosphere, wherein the SiC surface is protected against oxidation by the carbon coating.

9. The method as defined in claim 8, wherein the SiC single crystal is produced by chemical vapor deposition.

10. The method as defined in claim 8, wherein the SiC single crystal is produced by molecular beam epitaxy.

11. The method as defined in claim 8, wherein a silicon plane of the SiC single crystal that corresponds in the case of a cubic polytype of the SiC (β-SiC) to a (1 1 1) crystal surface, and corresponds in the case of a non-cubic polytype (α-SiC) to a (0 0 0 1) crystal surface, is used as the SiC surface.

12. The method as defined in claim 8, wherein a carbon plane of the SiC single crystal that corresponds in the case of a cubic polytype of the SiC (β-SiC) to a (−1 −1 −1) crystal surface, and corresponds in the case of a non-cubic polytype (α-SiC) to a (0 0 0 −1) crystal surface, is used as the SiC surface.

13. The method as defined in claim 8, wherein the carbon coating has substantially a graphite structure or a graphite-like structure.

14. The method as defined in claim 8, wherein a carbon coating having a thickness less than 1 nm is produced.

* * * * *